(12) United States Patent
Tang et al.

(10) Patent No.: US 11,196,342 B2
(45) Date of Patent: Dec. 7, 2021

(54) MULTIPHASE REGULATOR WITH PHASE CURRENT TESTING USING RAMP CURRENT PATTERNS

(71) Applicant: Infineon Technologies Austria AG, Villach (AT)

(72) Inventors: Benjamim Tang, Rancho Palos Verdes, CA (US); Richard Pierson, Newport Beach, CA (US); Scott Southwell, Seal Beach, CA (US); Tim Ng, Monterey Park, CA (US); Yi-Yuan Liu, Redondo Beach, CA (US); Brian Molloy, Milpitas, CA (US); Kenneth Ostrom, Palos Verdes Estates, CA (US); Amir Babazadeh, Laguna Hills, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/537,954

(22) Filed: Aug. 12, 2019

(65) Prior Publication Data

US 2019/0363631 A1 Nov. 28, 2019

Related U.S. Application Data

(60) Continuation of application No. 15/452,215, filed on Mar. 7, 2017, now Pat. No. 10,425,007, which is a
(Continued)

(51) Int. Cl.
*H02M 3/158* (2006.01)
*G01R 31/42* (2006.01)
(Continued)

(52) U.S. Cl.
CPC .......... *H02M 3/158* (2013.01); *G01R 19/04* (2013.01); *G01R 31/42* (2013.01);
(Continued)

(58) Field of Classification Search
CPC .......... H02M 3/02; H02M 3/10; H02M 3/135; H02M 3/137; H02M 3/139; H02M 3/142;
(Continued)

(56) References Cited

U.S. PATENT DOCUMENTS 6,433,527 B1  8/2002  Izadinia et al.
6,563,294 B2  5/2003  Duffy et al.
(Continued)

FOREIGN PATENT DOCUMENTS

CN   1588270 A    3/2005
CN  101005237 A   7/2007
(Continued)

OTHER PUBLICATIONS

"Multi-Rail Power Supply for Microcontrollers in Safety-Critical Applications", Product Preview, TPS65381-Q1, SLVSBC4, Texas Instruments Incorporated, May 2012, pp. 1-63.

*Primary Examiner* — Thienvu V Tran
*Assistant Examiner* — Carlos O Rivera-Perez
(74) *Attorney, Agent, or Firm* — Murphy, Bilak & Homiller, PLLC

(57) ABSTRACT

According to an embodiment, a multiphase regulator includes a plurality of output phases each of which is operable to deliver a phase current through a separate inductor to a load connected to the output phases via the inductors and an output capacitor. A controller is operable to regulate a voltage delivered to the load by adjusting the phase currents delivered to the load by the output phases, monitor the phase currents delivered to the load by the output phases, test the output phases in a predetermined sequence, and determine if the phase currents respond in a predetermined way.

14 Claims, 8 Drawing Sheets

Related U.S. Application Data division of application No. 13/928,005, filed on Jun. 26, 2013, now Pat. No. 9,621,045.

(51) Int. Cl.

| | | |
|---|---|---|
| *G01R 19/04* | (2006.01) | |
| *H02H 7/12* | (2006.01) | |
| *H02M 1/08* | (2006.01) | |
| *H02M 1/36* | (2007.01) | |
| *H02M 1/084* | (2006.01) | |
| *H02M 1/32* | (2007.01) | |
| *H02M 1/00* | (2006.01) | |

(52) U.S. Cl.
CPC ............ *H02H 7/1213* (2013.01); *H02M 1/08* (2013.01); *H02M 1/084* (2013.01); *H02M 1/36* (2013.01); *H02M 3/1584* (2013.01); *H02M 1/0009* (2021.05); *H02M 1/32* (2013.01)

(58) Field of Classification Search
CPC .... H02M 3/155; H02M 3/156; H02M 3/1563; H02M 3/157; H02M 3/158; H02M 3/1584; H02M 3/1588; H02M 1/08; H02M 1/081; H02M 1/082; H02M 1/084; H02M 1/0845; H02M 1/088; H02M 1/32; H02M 1/36; H02M 2001/0003; H02M 2001/0009; H02M 2001/0025; H02M 2001/0029; H02M 2001/0032; H02M 2001/0038; H02M 2001/0067; H02M 2001/325; H02M 2003/1586; H02M 3/1586; H02M 1/0003; H02M 1/0009; H02M 1/0025; H02M 1/0029; H02M 1/0032; H02M 1/0038; H02M 1/0067; H02M 1/325; H02H 7/1213; G01R 31/40; G01R 31/42; G01R 31/2832; G01R 31/2836; G01R 31/2837; G01R 31/2839; G01R 19/04; G01R 31/00; G01R 31/28; G01R 31/2827; G01R 31/30; G01R 31/3004; G01R 31/3012

USPC ........ 323/212–219, 222–226, 266, 268–280, 323/282–286, 351, 901, 908; 363/49, 50, 363/65; 361/18
See application file for complete search history.

(56) References Cited

U.S. PATENT DOCUMENTS

| | | |
|---|---|---|
| 6,795,009 B2 | 9/2004 | Duffy et al. |
| 6,965,502 B2 | 11/2005 | Duffy et al. |
| 7,023,672 B2 | 4/2006 | Goodfellow et al. |
| 7,262,628 B2 | 8/2007 | Southwell et al. |
| 7,492,134 B2 | 2/2009 | Tang et al. |
| 7,960,951 B2 | 6/2011 | Southwell et al. |
| 8,008,901 B2 | 8/2011 | Tang et al. |
| 8,086,355 B1 * | 12/2011 | Stanczak .................. G05F 3/02 700/286 |
| 2006/0001408 A1 | 1/2006 | Southwell et al. |
| 2007/0226557 A1 | 9/2007 | Fuseya |
| 2009/0058379 A1 | 3/2009 | Sreenivas |
| 2009/0066303 A1 | 3/2009 | Smith et al. |
| 2009/0121695 A1 | 5/2009 | Pierson et al. |
| 2009/0146643 A1 | 6/2009 | Ostrom et al. |
| 2009/0167271 A1 | 7/2009 | Tang et al. |
| 2010/0060222 A1 | 3/2010 | Kezobo et al. |
| 2010/0315051 A1 | 12/2010 | Maher |
| 2011/0221405 A1 | 9/2011 | Tang et al. |
| 2011/0260537 A1 | 10/2011 | Tang et al. |
| 2012/0139514 A1 | 6/2012 | Paatero |
| 2012/0153917 A1 | 6/2012 | Adell et al. |
| 2014/0232420 A1 | 8/2014 | Luo et al. |
| 2017/0179828 A1 | 6/2017 | Tang et al. |
| 2017/0179830 A1 | 6/2017 | Tang et al. |

FOREIGN PATENT DOCUMENTS

| | | |
|---|---|---|
| CN | 101227141 A | 7/2008 |
| CN | 101924468 A | 12/2010 |
| DE | 102007045220 A1 | 4/2009 |

* cited by examiner

MULTIPHASE REGULATOR WITH PHASE CURRENT TESTING USING RAMP CURRENT PATTERNS

FIELD OF TECHNOLOGY

The present application relates to multiphase regulators, in particular self-testing of multiphase regulators.

BACKGROUND

Switching power supplies or voltage regulators are popular for high power applications because of their high efficiency and the small amount of area/volume consumed by such regulators. Widely accepted switching voltage regulators include buck, boost, buck-boost, forward, flyback, half-bridge, full-bridge, and SEPIC topologies. Multiphase buck converters are particularly well suited for providing high current at low voltages needed by high-performance integrated circuits such as microprocessors, graphics processors, and network processors. Buck converters are typically implemented with active components such as a pulse width modulation (PWM) controller IC (integrated circuit), driver, power MOSFETs (metal-oxide-semiconductor field-effect transistors), and passive components such as inductors, transformers or coupled inductors, capacitors, and resistors. Parallel converters are also used in applications where high current requirements can be met by connecting multiple output converters in parallel and applying current sharing among them to meet the total output current requirement. The terms 'multiphase regulator' and 'parallel converter', and 'output phase' and 'output converter' are used interchangeably herein.

The large number of components in multiphase regulators and the typically high output current and power of such systems make it desirable to detect any component or connection failures in order to verify the full functionality of these systems and ensure that the voltage regulator operates properly over its entire operating range. Voltage, current, power and temperature monitoring are commonly implemented to ensure proper operation under varying, unpredictable and unforeseen operating conditions. These systems typically monitor voltage and current of the input and output terminals of the total system or of individual output phases.

There are many failure conditions in multiphase regulators where the regulator may still provide regulation under some conditions, but fail when the operating conditions change. For example, a voltage regulator with missing output phase components or connections may still properly regulate the output voltage under no load or light load conditions, but fail when the load current increases. The system may be able to regulate at the expected voltage, current, and temperature operating range under the no load or light load conditions, but fails to regulate when the load current increases. Additionally, the voltage regulator may operate in a suboptimal condition, at poor efficiency, for example, which often leads to thermal problems at high load currents. Most conventional systems provide simple fault protection based on voltage, current, power, and temperature monitoring, but fail to provide sophisticated fault protection that protects against more subtle or difficult to detect conditions where the regulator operates properly under some conditions, but not others.

SUMMARY

According to an embodiment of a multiphase regulator, the regulator comprises a plurality of output phases each operable to deliver a phase current through a separate inductor to a load connected to the output phases via the inductors and an output capacitor. The multiphase regulator further comprises a controller operable to regulate a voltage delivered to the load by adjusting the phase currents delivered to the load by the output phases, and monitor the phase currents delivered to the load by the output phases. The controller is further operable to determine if the monitored phase currents indicate any of the individual output phases, any of the individual inductors, or the output capacitor are faulty, even if the total current delivered to the load is within specified limits.

According to an embodiment of a method of operating the multiphase regulator, the method comprises: regulating a voltage delivered to the load by adjusting the phase currents delivered to the load by the output phases; monitoring the phase currents delivered to the load by the output phases; and determining if the monitored phase currents indicate any of the individual output phases, any of the individual inductors or the output capacitor are faulty even if the total current delivered to the load is within specified limits.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide sophisticated monitoring and detection methods for identifying conditions where a multiphase regulator is not operating properly, preventing the regulator from suffering significant failure during operation. The controller of the multiphase regulator performs self-testing of the regulator using sophisticated methods to look at the information available within the controller to detect abnormal operating conditions, or using specific operation modes to exercise the system such that abnormal operating conditions can be detected. In each case, the controller can detect many failure conditions where the multiphase regulator still provides regulation under some conditions, but fails when the operating conditions change.

Figure 1:
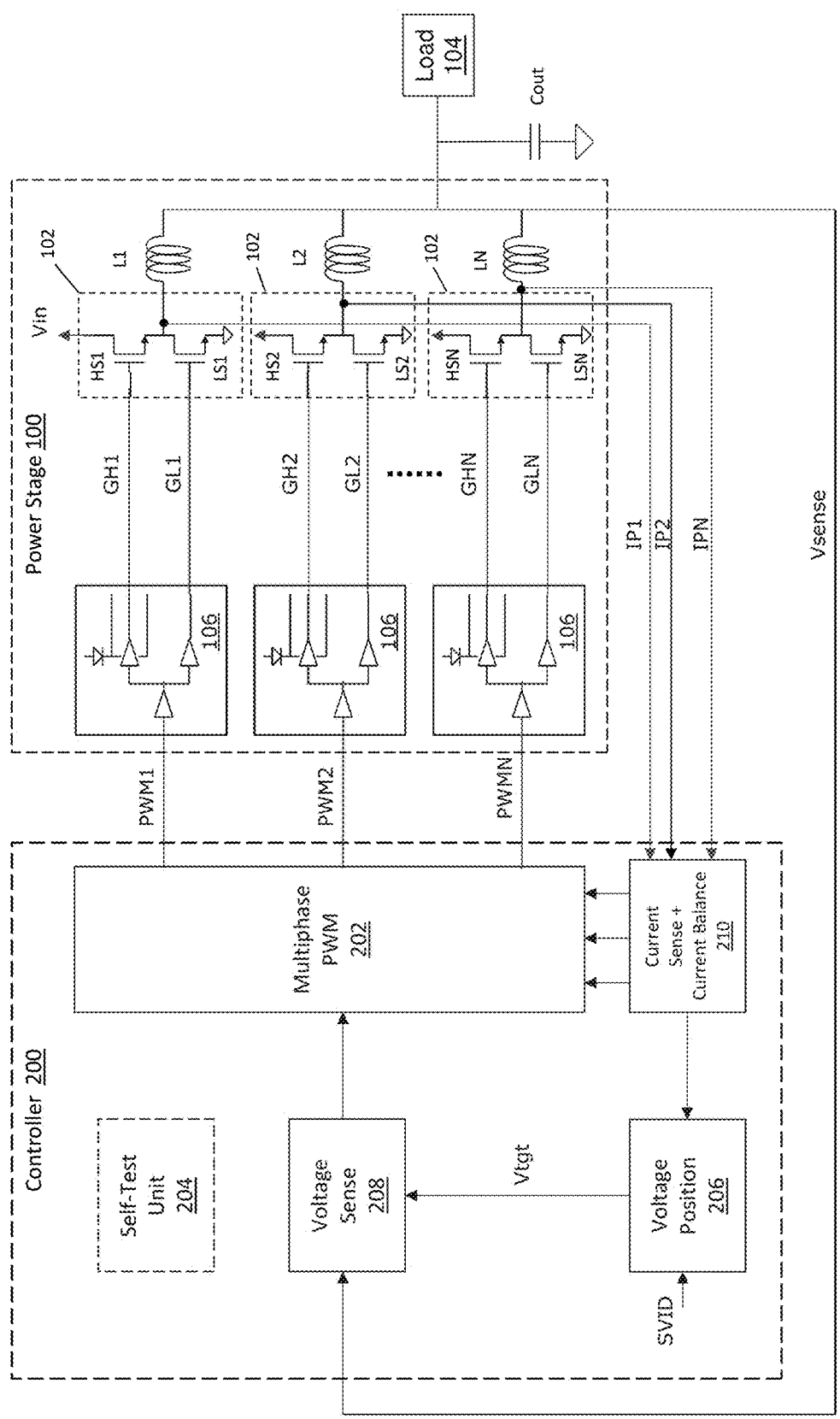
FIG. 1 illustrates a block diagram of an embodiment of a multiphase regulator having a controller with a self-test unit.

FIG. 1 illustrates an embodiment of a multiphase regulator comprising a power stage 100 including a plurality of output phases 102 and a controller 200 for controlling operation of the power stage 100. Each output phase 102 is operable to deliver a phase current (IPX) through a separate inductor (LX) to a load 104 connected to the output phases 102 via the inductors and an output capacitor (Cout). Each output phase 102 has a high-side transistor (HSX) and a low-side transistor (LSX) for coupling to the load 104 through the corresponding inductor. The high-side transistor of each output phase 102 switchably connects the load 104 to an input voltage (Vin) of the multiphase regulator, and the corresponding low-side transistor switchably connects the load 104 to ground at different periods. Three output phases 102 are shown in FIG. 1 (N=3), however the power stage 100 can include any number of output phases 102 greater than one (i.e. N≥12).

The controller 200 regulates the voltage (Vsense) delivered to the load 104 by the power stage 100, by adjusting the phase currents delivered to the load 104 by the output phases 102. The controller 200 includes a multiphase pulse width modulator (PWM) 202 for switching the output phases 102 of the power stage 100 so that the power stage 100 sources positive current to the load 104 through one or more of the high-side transistors during some periods and sinks negative current from the load 104 through one or more of the low-side transistors during other periods. That is, the multiphase regulator can operate in a continuous conduction mode (CCM) with current sinking capability. For example, only the first output phase (N=1) 102 may be active at times, e.g., during light load conditions. One or more additional output phases (N=2 or greater) 102 can be activated to support greater power demands by the load 104. To this end, the multiphase PWM 202 provides PWM control signals (PWM1, PWM2, . . . , PWMN) to a corresponding driver 106 connected to each output phase 102 of the power stage 100.

The drivers 106 provide gate drive signals (GHX, GLX) to the gates of the high-side and low-side transistors of the corresponding output phases 102, in response to the PWM control signals provided by the multiphase PWM 202. The activation state of the output phases 102 and the duty cycle of the high-side and low-side transistors are determined at least in part based on the output voltage (Vsense) applied to the load 104 so that the regulator can react as quickly and reliably as possible to changing load conditions. The controller 200 can also set the multiphase regulator in DCM (discontinuous conduction mode).

In addition to regulating the voltage delivered to the load 104, the controller 200 also monitors the phase currents delivered to the load 104 by the output phases 102 and determines if the monitored phase currents indicate that any of the individual output phases 102, any of the individual inductors, or the output capacitor are faulty, even if the total current delivered to the load 104 is within specified limits. To this end, a self-test unit 204 included in or associated with the controller 200 uses information available within the controller 200 to detect abnormal operating conditions, or uses specific operation modes to exercise the regulator such that abnormal operating conditions can be detected. For example, if the multiphase regulator has missing output phase components or connections, the regulator may still properly regulate the output voltage under no load or light load conditions, but fail when the load current increases. That is, the multiphase regulator may be able to regulate at the expected voltage, current, and temperature operating range under the no load or light load conditions, but fails to regulate when the load current increases. Additionally, the multiphase regulator may operate in a suboptimal condition, at poor efficiency for example, which could lead to thermal problems at high load currents. The self-test unit 204 of the controller 200 can detect faulty components under each of these conditions, and prevent damage to the regulator e.g. by disabling one or more problematic output phases 102 or shutting down the regulator. Various embodiments of the self-test unit 204 are described in more detail later herein, after a more detailed embodiment of the controller 200 is described first.

The controller 200 also includes a voltage position unit 206 for controlling the change from one SVID to another by ramping the target voltage, where SVID is voltage identification information provided to the multiphase regulator for implementing power supply voltage changes. The controller 200 also includes a voltage sense unit 208 for determining the error between the output voltage (Vsense) and the target voltage (Vtgt) provided by the voltage position unit 206, and converting the error voltage into a digital representation provided to the multiphase PWM 202. The controller 200 also includes a current sense and balance unit 210 for sensing the individual phase currents (IP1, IP2, . . . , IPN) of the output phases 102 and converting the sensed current information into phase current information. The current sense and balance unit 210 also converts the phase current information into adjustments to the duty cycle of each individual output phase 102 for adjusting the phase currents so they remain balanced.

Figure 2:
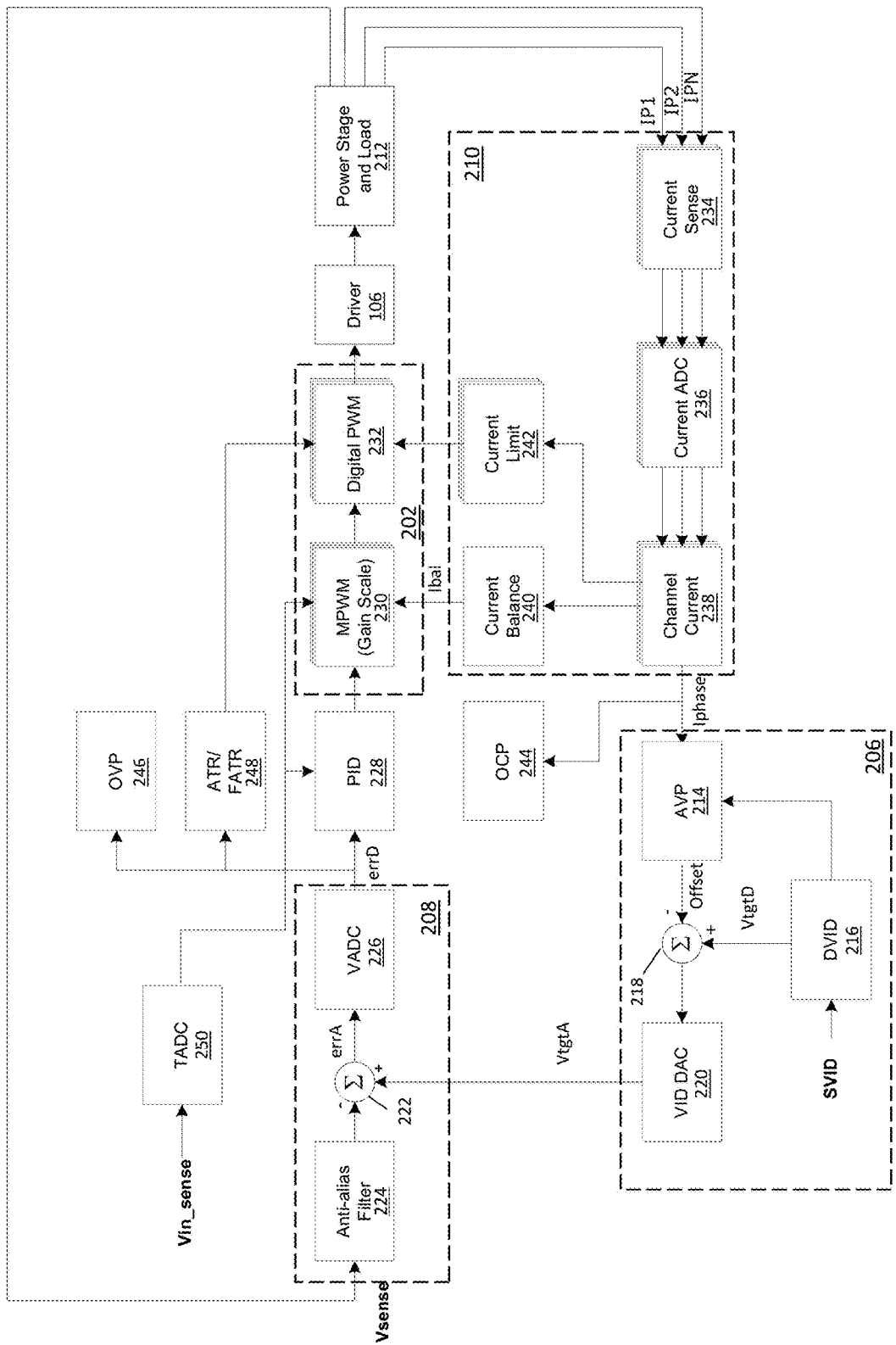
FIG. 2 illustrates a block diagram of the controller included in the multiphase regulator.

FIG. 2 illustrates an embodiment of the controller 200 in more detail. In FIG. 2, the power stage 102, output capacitor, and load 104 are represented by a single block 212 for ease of illustration. According to this embodiment, the voltage position unit 206 comprises an adaptive voltage positioning (AVP) circuit 214 for converting phase current information (Iphase) from the current sense and balance unit 210 into an offset (Offset) from the set-point to set the regulator target voltage based on the load current. The voltage position unit 206 also comprises a dynamic voltage transition circuit (DVID) 216 for converting the desired SVID to a digital target voltage (VtgtD), a comparator 218 for comparing the offset and the digital target voltage, and a reference DAC (digital to analog converter) 220 for setting the target voltage for the regulator as an analog reference voltage (VtgtA). A second comparator 222 compares the analog reference voltage to the sensed output voltage (Vsense). The second comparator 222 is part of the voltage sense unit 208.

The voltage sense unit 208 also includes an anti-aliasing filter 224 for filtering the sensed output voltage prior to the comparison with the analog reference voltage (VtgtA), and a voltage sense ADC (analog to digital converter) 226 for converting the analog error voltage (errA) i.e. the difference between VtgtA and Vsense, into a digital representation (errD). A PID (proportional-integral-derivative) filter 228 implements a compensator transfer function with the digital error voltage as an input and duty cycle as the output. A multiphase PWM gain unit 230 of the multiphase PWM 202 sets the gain for the different output phases 102 based on the output of the PID filter 228 and current balance information (Ibal) from the current sense and balance unit 210. A digital PWM 232 of the multiphase PWM 202 converts the digital duty cycle information into a pulse width modulated waveform that interfaces with the driver 106 to control the switch states of the output phases 102 of the power stage 100.

The current sense and balance unit 210 includes current sense circuitry 234 for monitoring the individual phase currents (IP1, IP2, . . . , IPN) of the N output phases where N≥2, and a current sense ADC 236 for converting the monitored phase currents into corresponding digital phase current information which is processed by channel current circuitry 238 for each output phase 102. The output of the channel current circuitry 238 is provided to the AVP circuit 214, a current balance circuit 240, and a current limit circuit 242. The current balance circuit 240 converts the phase current information from the channel current circuitry 238 into corresponding adjustments to the duty cycle of each individual output phase 102, to adjust the phase currents so they remain balanced. The current limit circuit 242 monitors the phase currents and can force the multiphase PWM 202 to modify the PWM pulses to ensure that the phase current does not exceed a positive or negative limit. An over current protection (OCP) circuit 244 can be provided for shutting down the multiphase regulator if regulator operation cannot be maintained without exceeding some other positive or negative limit. An over voltage protection (OVP) circuit 246 can be provided for monitoring the output voltage to ensure that the output voltage is within some reasonable bound of operation. The OVP circuit 246 can also shut down the multiphase regulator if regulator operation cannot be maintained without exceeding some limit. The controller 200 can also include an active transient response (ATR) or fast ATR (FATR) circuit 248 for providing a quick response to fast load transients, and another ADC 250 for providing a digital representation of the sensed input voltage (Vin_sense) to the PID filter 228 and the multiphase PWM gain unit 230. The controller components shown in FIG. 2 are known components of a multiphase regulator, and therefore no further explanation of their operation is given in this regard.

The self-test unit 204 of the controller 200 uses information provided by at least some of the controller components to detect abnormal operating conditions, or uses specific operation modes of the controller 200 to exercise the multiphase regulator such that abnormal operating conditions can be detected. The self-test unit 204 detects faulty components coupled to the controller 200, which can compromise reliable operation of the multiphase regulator.

Figure 3:
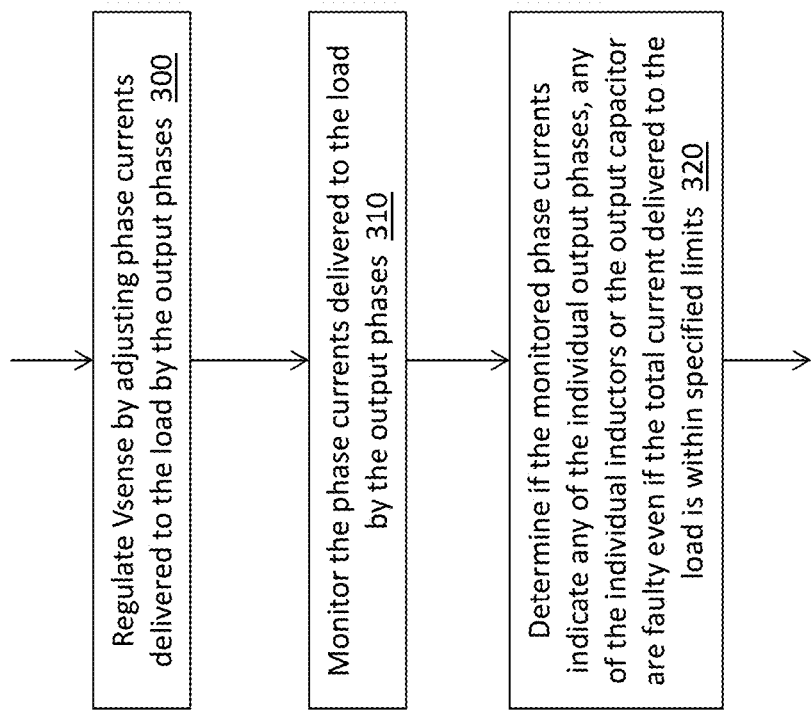
FIG. 3 illustrates a flow diagram of an embodiment of a self-test method performed by the self-test unit included in the multiphase regulator.

FIG. 3 illustrates an embodiment of a method of detecting faults in the components external to the controller 200, as implemented by the self-test unit 204. The method includes regulating a voltage delivered to the load 104 by adjusting the phase currents delivered to the load 104 by the output phases 102 (Step 300), monitoring the phase currents delivered to the load 104 by the output phases 102 (Step 310), and determining if the monitored phase currents indicate any of the individual output phases 102, any of the individual inductors (LX) or the output capacitor (Cout) are faulty even if the total current delivered to the load 104 is within specified limits (Step 320).

Figure 4:
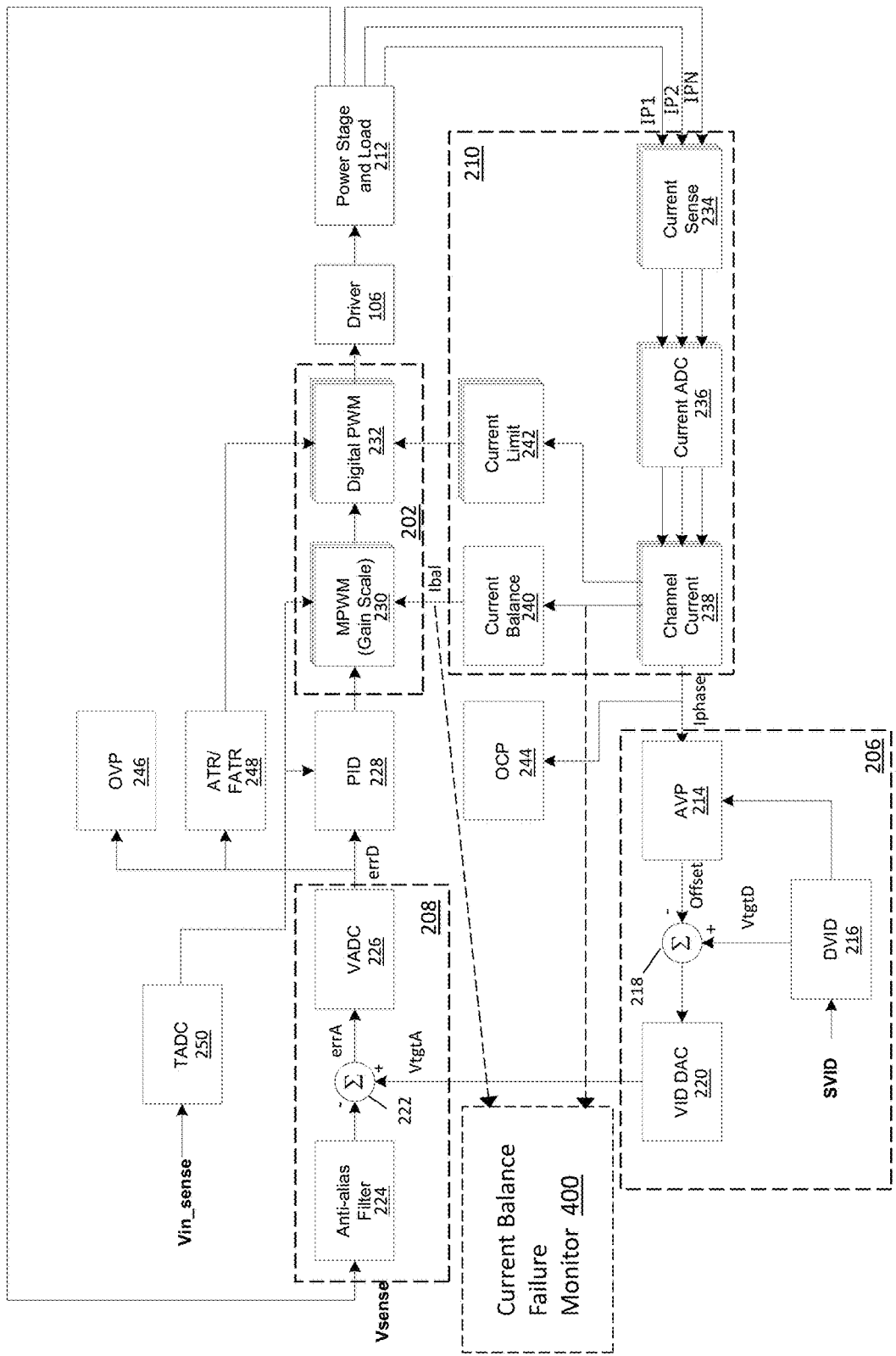
FIG. 4 illustrates a block diagram of an embodiment of the self-test unit included in the controller of the multiphase regulator.

FIG. 4 illustrates one embodiment of the self-test unit 204. According to this embodiment, the self-test unit 204 includes a current balance failure monitor 400. The current balance failure monitor 400 analyzes the input and output of the current balance circuit 240, as indicated by the two dashed lines leading to the current balance failure monitor 400. The current balance circuit 240 adjusts the PWM duty cycle of each individual output phase 102 to increase or decrease the corresponding phase current relative to the other output phases 102. This is typically done by a filter with the transfer function:

$$dUx = (Ix - Itargx) * (Ki\_ibal/s + Kp\_ibal) \quad (1)$$

where dUx is the adjustment to the duty cycle in the Xth output phase 102, Ix is the measured current in the Xth output phase 102, Itargx is the target current for the Xth output phase 102, and Ki_ibal and Kp_ibal are the integral and proportional gain, respectively.

The current balance circuit 240 adjusts individual phase currents to match a certain allocation as determined by the controller 200 for the total load current, between active ones of the output phases 102. Current balance failure can occur when the multiphase regulator cannot adjust the phase currents to match the allocation, indicating the regulator cannot adequately control one or more of the output phases 102. Such a condition can be caused by a bad driver 106, output phase transistor, inductor, or current sense network 234.

The current balance failure monitor 400 monitors whether all output phases 102 are actively regulating with similar response to the multiphase PWM 202. For example, the current balance failure monitor 400 can monitor the ability of each output phase 102 to drive Ix towards Itargx (i.e., drive the error to zero), and monitor whether each output phase 102 converges on an acceptable output dUx (i.e. no sustained clipping). The current balance failure monitor 400 detects a current balance failure condition when any of the individual phase currents do not match the corresponding allocation for that active output phase 102, or the adjustments allowed by the current balance circuit 240 are at its upper or lower limit (i.e., clipping occurs). Current balance failure can be more readily detected when the allocations are changed in a predetermined way e.g. in a test mode of the multiphase regulator. The current balance failure monitor 400 can provide this predetermined (known) allocation. For example, an offset may be dynamically added to determine whether the current balance circuit 240 is able to respond to the changing offset by rebalancing the phase currents in a predetermined (expected) way. The current balance failure monitor 400 of the self-test unit 204 detects an abnormal condition if the phase currents are not rebalanced in the predetermined way.

Figure 5:
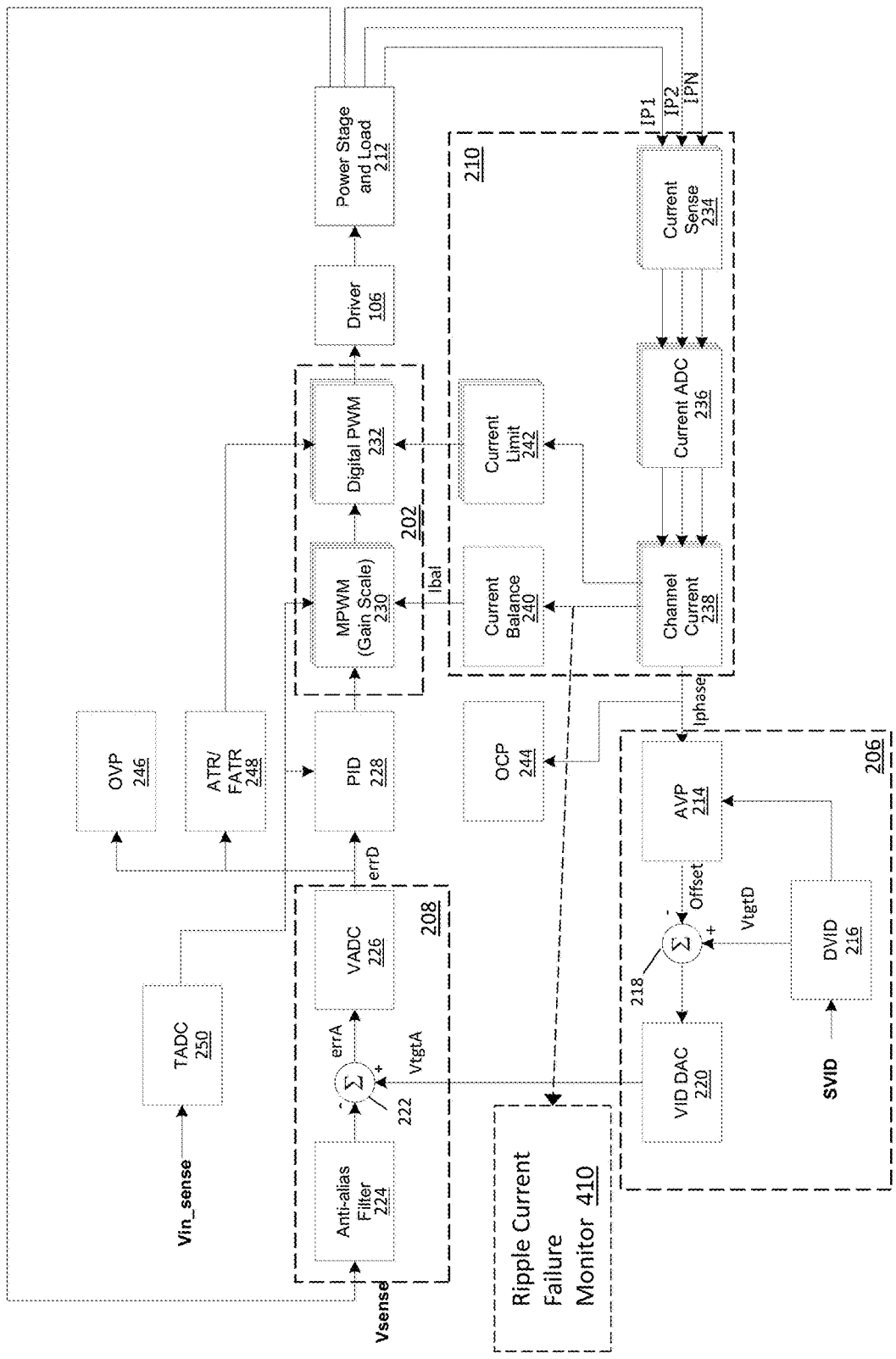
FIG. 5 illustrates a block diagram of the self-test unit included in the controller of the multiphase regulator according to another embodiment.

FIG. 5 illustrates another embodiment of the self-test unit 204. According to this embodiment, the self-test unit 204 includes a ripple current failure monitor 410. The ripple current failure monitor 410 analyzes the input of the current balance circuit 240, as indicated by the single dashed line leading to the ripple current failure monitor 410. During normal operation of the multiphase switching regulator, the phase currents should either be increasing or decreasing depending on the power switch state. A properly operating output phase 102 will always have some ripple current. The ripple current pattern is well known and easily identifiable in the current sense waveform due to the synchronous switching nature of the regulator. The ripple current may change from DCM to CCM, so the ripple current failure monitor 410 should be aware of the mode of operation. Inability to detect an expected ripple current pattern and an expected amplitude current ripple may be indicative of a bad driver 106, output stage transistor, inductor, or current sense network 234. The ripple current failure monitor 410 monitors the output of the channel current circuitry 238, and looks for bad ripple current patterns anytime an output phase 102 is in active regulation or in a specific test mode. The ripple current failure monitor 410 detects if any of the phase currents fail to have a ripple current pattern that matches the corresponding expected ripple current pattern.

Figure 6:
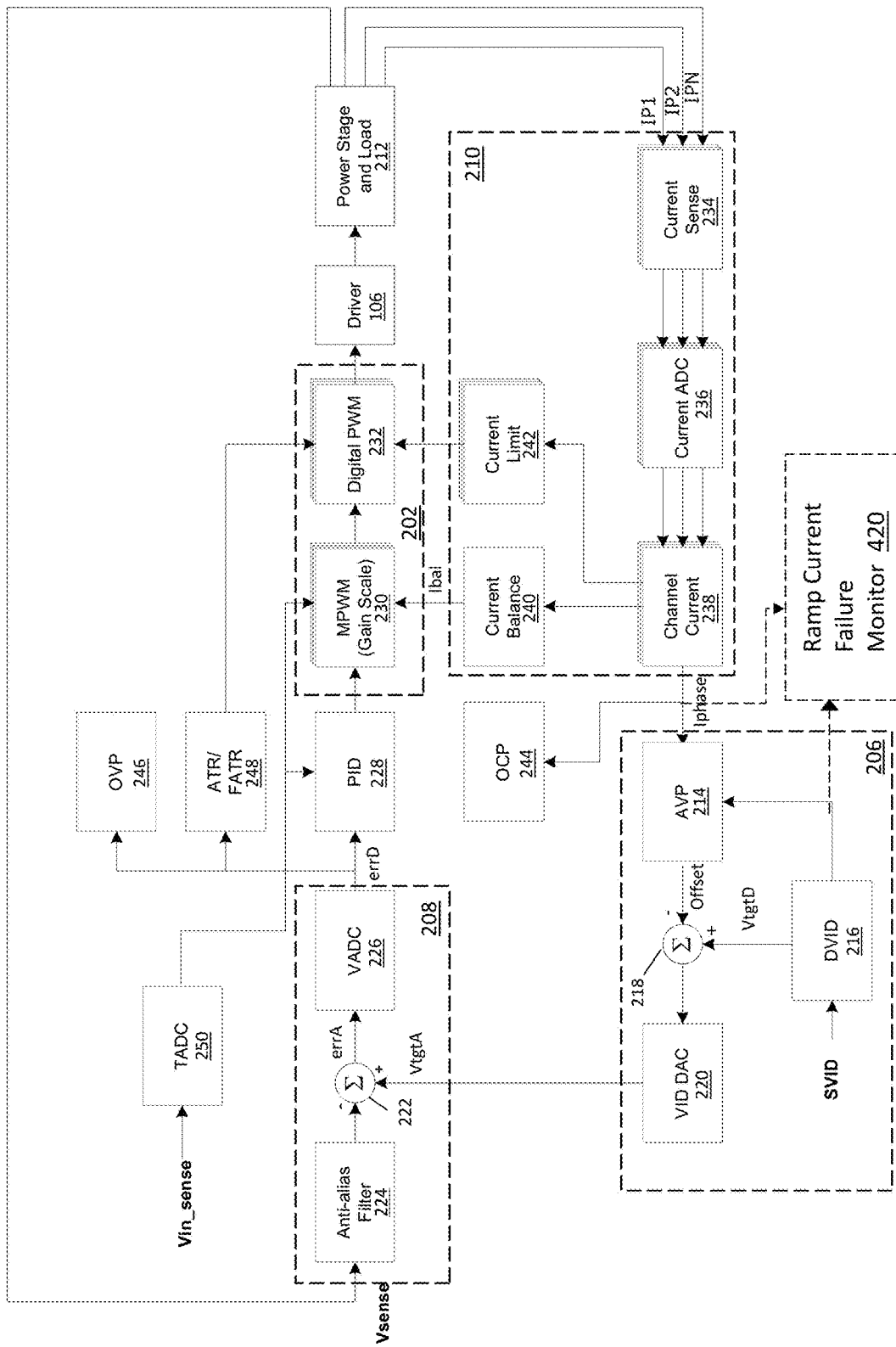
FIG. 6 illustrates a block diagram of the self-test unit included in the controller of the multiphase regulator according to yet another embodiment.

FIG. 6 illustrates yet another embodiment of the self-test unit 204. According to this embodiment, the self-test unit 204 includes a ramp current failure monitor 420. The ramp current failure monitor 420 analyzes the outputs of the dynamic voltage transition circuit (DVID) 216 and the channel current circuitry 238, as indicated by the two dashed lines leading to the ramp current failure monitor 420. Startup of the multiphase regulator can be profiled to determine the typical profile of the startup ramp current. For example, there is an upper and lower limit expected based on the startup rate and the total output capacitance. There is also a voltage range where the load 104 is not expected to be turned on. For example, there is a minimum voltage for operation of integrated circuits. The ramp current failure monitor 420 checks the startup ramp to determine whether the current profile is within an expected range when starting up from a known operating condition, such as when the output capacitor is fully discharged. Changes in the current profile may be indicative of problems such as a bad driver 106, output phase transistor, inductor, current sense network 234, or leaky output capacitor. The ramp current failure monitor 420 can similarly force an up or down ramp in a test mode to check the ramp current. This allows both positive and negative currents to be measured, as well as the ability of the multiphase regulator to source and sink current.

In one embodiment, the controller 200 ramps up the voltage delivered to the load 104 to charge the output capacitor. The voltage ramping causes active ones of the output phases 102 to source current to the load. The change in voltage can be profiled to determine an expected ramp current pattern of the ramp-up current based on the corresponding output dV/dt and capacitance. The ramp current failure monitor 420 detects if any of the currents sourced by the active output phases 102 fail to have a ramp current pattern that matches the expected ramp current pattern. This testing can be performed in a startup mode of the multiphase regulator.

In another embodiment, the controller 200 ramps down the voltage delivered to the load 104 to discharge the output capacitor. The voltage ramping causes one or more of the output phases 102 to sink current from the load 104. Again, the change in voltage can be profiled to determine an expected ramp current pattern of the ramp-down current based on the corresponding output dV/dt and capacitance. The ramp current failure monitor 420 detects if any of the currents sunk by the output phases 102 fail to have a ramp current pattern that matches an expected ramp current pattern.

Figure 7:
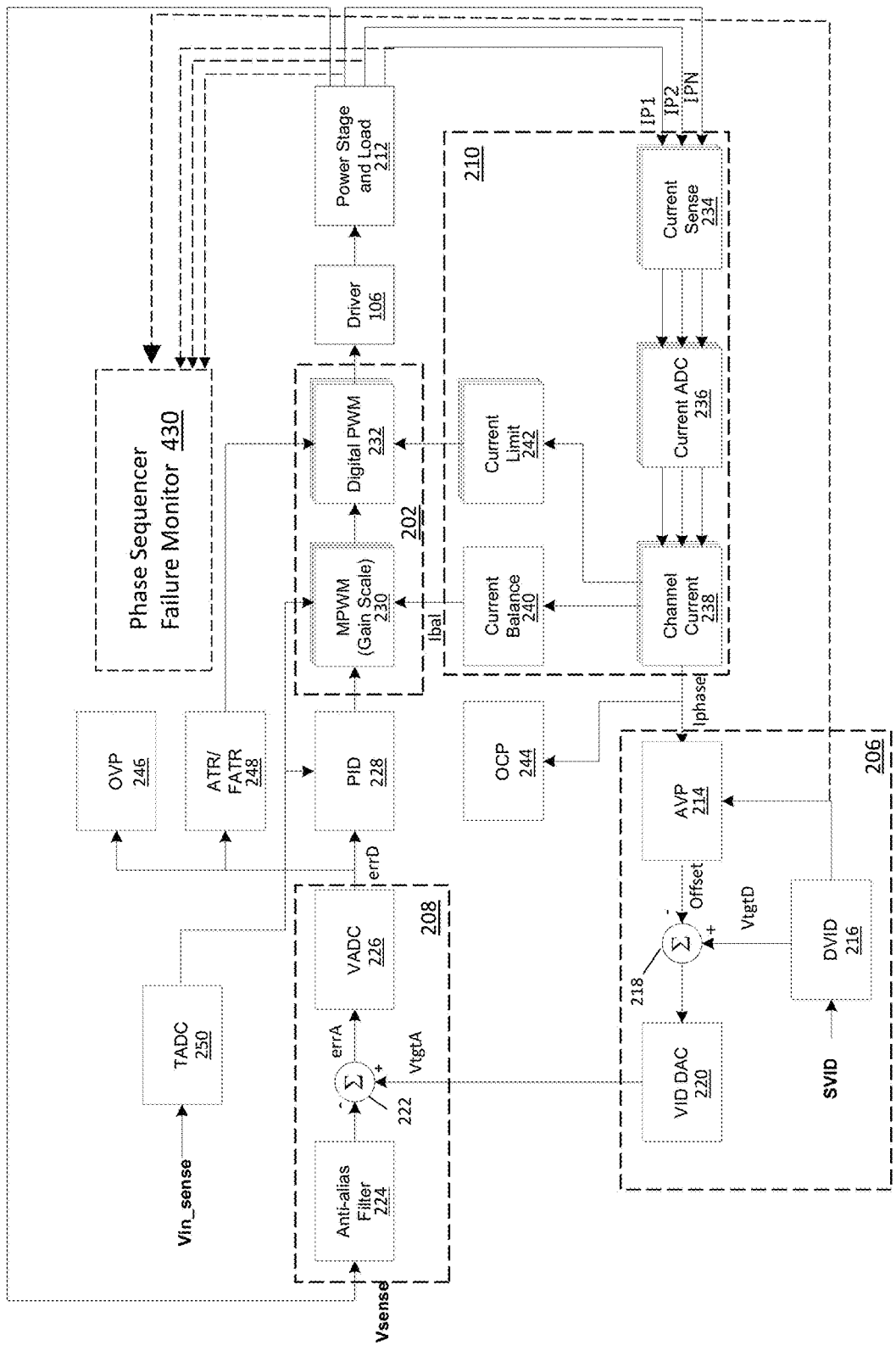
FIG. 7 illustrates a block diagram of the self-test unit included in the controller of the multiphase regulator according to still another embodiment.

FIG. 7 illustrates still another embodiment of the self-test unit 204. According to this embodiment, the self-test unit 204 includes a phase sequence failure monitor 430. The phase sequence failure monitor 430 analyzes the phase currents (IP1, IP2, . . . , IPN) and the output of the dynamic voltage transition circuit (DVID), as indicated by the four dashed lines leading to the phase sequence failure monitor 430. The multiphase regulator can operate in single-phase mode, where only one output phase 102 is active and regulating the output. The phase sequence failure monitor 430 tests whether each output phase 102 is working properly by sequencing one or several output phases 102 at a time, to ensure that each output phase 102 is working properly. The phase sequence failure monitor 430 determines if the corresponding monitored phase currents respond in a predetermined (expected) way.

According to one embodiment, the phase sequence failure monitor 430 monitors the phase currents and the output voltage (Vsense) during sequencing of the output phases 102. For example, the phase sequence failure monitor 430 can check that each output phase 102 is functioning properly by operating the multiphase regulator with only one output phase 102 at a time and checking the corresponding regulated output voltage. The sequence can be designed in a way so that each output phase 102 at some point is the only one that is active, and the phase sequence failure monitor 430 checks whether the resulting output voltage is still in regulation for each active output phase 102. For example, the regulation pattern for a 3-phase regulator could be: all output phases; output phase 1; output phases 1+2; output phase 2; output phases 2+3; output phase 3; and all output phases. If any of the output phases 102 are not operating properly, checking only the output voltage may be sufficient to detect a failure. However, checking phase current and output voltage during the entire sequence provides more robust failure monitoring.

The controller 200 can also check the output phases 102 by having one output phase 102 source current while another output phase 102 sinks current to ensure that all output phases 102 have proper source and sink capability and that the current sense network 234 is working properly. The phase sequence failure monitor 430 determines if the monitored phase current for the first output phase 102 is sunk in a predetermined (expected) way and if the monitored phase current for the second output phase 102 is sourced in a predetermined way. Phase sequencing failures can occur when any output phase 102 is not able to properly operate due to a missing or failed power stage component. The phase sequence failure monitor 430 can check for phase sequence failures during single phase active regulation or in a specific test mode using single phase regulation.

Figure 8:
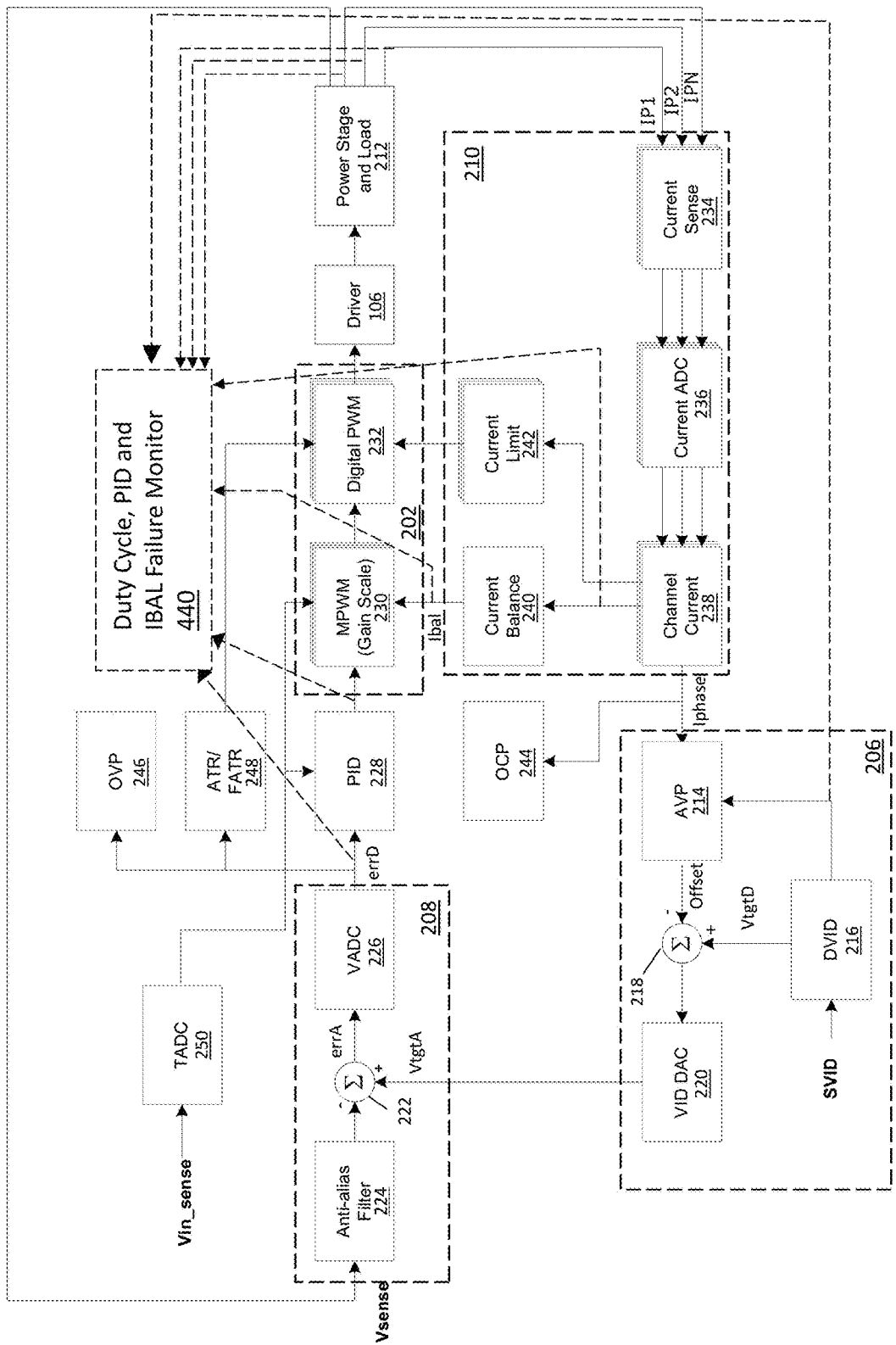
FIG. 8 illustrates a block diagram of the self-test unit included in the controller of the multiphase regulator according to another embodiment.

FIG. 8 illustrates another embodiment of the self-test unit 204. According to this embodiment, the self-test unit 204 includes a duty cycle, PID and current balance failure monitor 440. The duty cycle, PID and current balance failure monitor 440 analyzes the phase currents (IP1, IP2, . . . , IPN) and the outputs of the dynamic voltage transition circuit (DVID), voltage sense ADC (analog to digital converter) 226, PID filter 228, current balance circuit 240, and channel current circuitry 238, as indicated by the eight dashed lines leading to the duty cycle, PID and current balance failure monitor 440. The multiphase regulator operates with an expected duty cycle, given the output voltage and the input voltage. Similarly, a loop filter such as the PID filter 228 and a current balance loop filter included in the current sense and balance unit 210 have an expected output during normal operation. The duty cycle and loop filter output ranges may change greatly during transients, so simply checking an upper and lower limit is not adequate. The duty cycle, PID and current balance failure monitor 440 can detect conditions such as missing transistors which result in poor efficiency, requiring wider duty cycles to maintain regulation, and possibly clipping of the loop filter outputs. The duty cycle, PID and current balance failure monitor 440 correlates the duty cycle and loop filter outputs of the controller 200 to the monitored phase currents (IP1, IP2, . . . , IPN), the voltage delivered to the load and the input voltage of the regulator. Defective output phases 102, inductors and other components external to the controller 200 can be detected if the correlation determined by the duty cycle, PID and current balance failure monitor 440 fails to match an expected correlation. The monitoring can be done anytime in active regulation or in a specific test mode.

The self-test techniques described herein enable the controller 200 to detect conditions where the output may be in regulation due to the parallel structure of the multiphase regulator, but there is a defect in the power train including but not limited to: failed or missing drivers 106 that do not switch; failed or missing high-side transistors; failed or missing low-side transistors; failed or missing or badly out of spec inductors; extremely leaky output capacitor; failed or missing current sense RC network 234; and/or open or shorted traces (e.g., PWM, Vsense, IP1 . . . IPN). The self-test techniques described herein leverage features provided by the controller 200 such as current sense, current balance, specific modes of operation (e.g., start-up), etc. to monitor or exercise functions that are designed to detect such defects. The controller 200 can disable each problematic output phase 102 or shutdown the entire regulator.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A multiphase regulator, comprising:
a plurality of output phases, each output phase being operable to deliver a phase current through a separate inductor coupled to that output phase to a load connected to the output phases via the separate inductors and an output capacitor; and
a controller operable to perform self-testing of the multiphase regulator based on information available within the controller, the self-testing including ramping up a voltage delivered to the load to charge the output capacitor, the voltage ramp up causing active ones of the output phases to source current to the load, and detecting if any phase currents sourced by the active ones of the output phases fail to have a ramp current pattern that matches an expected ramp current pattern,
wherein as part of the self-testing performed by the controller, the controller is operable to determine if the detected phase currents indicate any of the output phases, any of the separate inductors or the output capacitor are faulty even if a total current delivered to the load is within specified limits.

2. The multiphase regulator of claim 1, wherein as part of the self-testing performed by the controller, the controller is operable to ramp up the voltage delivered to the load in a startup mode of the multiphase regulator.

3. The multiphase regulator of claim 1, wherein the expected ramp current pattern is based on an output voltage ramp and a capacitance of the output capacitor.

4. The multiphase regulator of claim 1, wherein as part of the self-testing performed by the controller, the controller is operable to ramp down the voltage delivered to the load to discharge the output capacitor, the voltage ramping down causing the output phases to sink current from the load, and detect if any of the currents sunk by the output phases fail to have a ramp down current pattern that matches an expected ramp down current pattern.

5. The multiphase regulator of claim 1, wherein as part of the self-testing performed by the controller, the controller is operable to force a first one of the output phases to sink current, force a second one of the output phases to source current, and determine if a detected ramp current pattern for the first output phase matches an expected ramp current pattern for the first output phase and if a detected ramp current pattern for the second output phase matches an expected ramp current pattern for the second phase.

6. The multiphase regulator of claim 1, wherein the controller is further operable to disable each output phase whose detected current has the ramp current pattern that does not match the expected ramp current pattern.

7. A method of operating a multiphase regulator having a plurality of output phases, each output phase for delivering a phase current through a separate inductor to a load connected to the plurality of output phases via the separate inductors and an output capacitor, the method comprising:
performing self-testing of the multiphase regulator by a controller of the multiphase regulator, based on information available within the controller,
wherein the self-testing performed by the controller comprises:
ramping up a voltage delivered to the load to charge the output capacitor, the voltage ramp up causing active ones of the output phases to source current to the load;
detecting if any phase currents sourced by the active ones of the output phases fail to have a ramp current pattern that matches an expected ramp current pattern; and
determining if the detected phase currents indicate any of the output phases, any of the separate inductors or the output capacitor are faulty even if a total current delivered to the load is within specified limits.

8. The method of claim 7, wherein the voltage is ramped up during a startup mode of the multiphase regulator.

9. The method of claim 7, wherein the expected ramp current pattern is based on an output voltage ramp and a capacitance of the output capacitor.

10. The method of claim 7, wherein the self-testing performed by the controller further comprises:
ramping down the voltage delivered to the load to discharge the output capacitor, the voltage ramping down causing the output phases to sink current from the load; and
detect if any of the currents sunk by the output phases fail to have a ramp down current pattern that matches an expected ramp down current pattern.

11. The method of claim 7, wherein the self-testing performed by the controller further comprises:
forcing a first one of the output phases to sink current;
forcing a second one of the output phases to source current; and
determining if a detected ramp current pattern for the first output phase matches an expected ramp current pattern for the first output phase, and if a detected ramp current pattern for the second output phase matches an expected ramp current pattern for the second phase.

12. The method of claim 7, further comprising:
disabling each output phase whose detected current has the ramp current pattern that does not match the expected ramp current pattern.

13. A multiphase regulator, comprising:
a plurality of output phases, each output phase being operable to deliver a phase current through a separate inductor coupled to that output phase to a load connected to the output phases via the separate inductors and an output capacitor; and
a controller operable to perform self-testing of the multiphase regulator based on information available within the controller, the self-testing including ramping up a voltage delivered to the load to charge the output capacitor, the voltage ramp up causing active ones of the output phases to source current to the load, and detecting if any phase currents sourced by the active ones of the output phases fail to have a ramp current pattern that matches an expected ramp current pattern,
wherein the controller is further operable to regulate the voltage delivered to the load by adjusting the phase currents delivered to the load by the output phases, monitor the phase currents delivered to the load by the output phases, and determine if the monitored phase currents indicate any of the output phases, any of the separate inductors or the output capacitor are faulty even if a total current delivered by the multiphase regulator to the load is within specified limits.

14. A method of operating a multiphase regulator having a plurality of output phases, each output phase for delivering a phase current through a separate inductor to a load connected to the plurality of output phases via the separate inductors and an output capacitor, the method comprising:
performing self-testing of the multiphase regulator by a controller of the multiphase regulator, based on information available within the controller, wherein the self-testing performed by the controller comprises:
ramping up a voltage delivered to the load to charge the output capacitor, the voltage ramp up causing active ones of the output phases to source current to the load; and
detecting if any phase currents sourced by the active ones of the output phases fail to have a ramp current pattern that matches an expected ramp current pattern;
regulating the voltage delivered to the load by adjusting the phase currents delivered to the load by the output phases,
wherein the self-testing performed by the controller further comprises:
monitoring the phase currents delivered to the load by the output phases; and
determining if the monitored phase currents indicate any of the output phases, any of the separate inductors or the output capacitor are faulty even if a total current delivered by the multiphase regulator to the load is within specified limits.

* * * * *